United States Patent
Tomikawa et al.

(10) Patent No.: US 9,433,097 B2
(45) Date of Patent: Aug. 30, 2016

(54) CIRCUIT SUBSTRATE AND METHOD FOR MANUFACTURING THE SAME

(71) Applicant: IBIDEN CO., LTD., Ogaki (JP)

(72) Inventors: Mitsuhiro Tomikawa, Ogaki (JP); Koji Asano, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 14/791,735

(22) Filed: Jul. 6, 2015

(65) Prior Publication Data

US 2016/0007468 A1 Jan. 7, 2016

(30) Foreign Application Priority Data

Jul. 3, 2014 (JP) ................. 2014-137451

(51) Int. Cl.
| | |
|---|---|
| *H05K 1/18* | (2006.01) |
| *H05K 3/40* | (2006.01) |
| *H05K 1/11* | (2006.01) |
| *H05K 3/00* | (2006.01) |

(52) U.S. Cl.
CPC .............. *H05K 1/183* (2013.01); *H05K 1/115* (2013.01); *H05K 3/0014* (2013.01); *H05K 3/4046* (2013.01); *H05K 3/4084* (2013.01)

(58) Field of Classification Search
CPC .... H05K 1/115; H05K 1/183; H05K 3/4084; H05K 3/0014
See application file for complete search history.

(56) References Cited

FOREIGN PATENT DOCUMENTS

JP 2013-135168 7/2013

OTHER PUBLICATIONS

U.S. Appl. No. 14/791,641, filed Jul. 6, 2015, Tomikawa, et al.
U.S. Appl. No. 14/802,139, filed Jul. 17, 2015, Tomikawa, et al.

*Primary Examiner* — Jeremy C Norris
(74) *Attorney, Agent, or Firm* — Oblon, McClelland, Maier & Neustadt, L.L.P.

(57) ABSTRACT

A circuit substrate includes a core substrate having cavity, metal blocks in the cavity, first and second build-up layers including insulating layers and laminated on first and second sides of the core substrate such that the insulating layers are covering the cavity, and a filling resin filling gap formed between the cavity and metal blocks in the cavity. The cavity is penetrating through the core substrate, the core substrate has an intracavity projection structure projecting from one or more side surfaces of the cavity such that the projection structure is positioned between the metal blocks and separating the metal blocks from contacting each other in the cavity, the first build-up layer has first conductors connected to the metal blocks such that each first conductor conducts electricity or heat, and the second build-up layer has second conductors connected to the metal blocks such that each second conductor conducts electricity or heat.

20 Claims, 14 Drawing Sheets

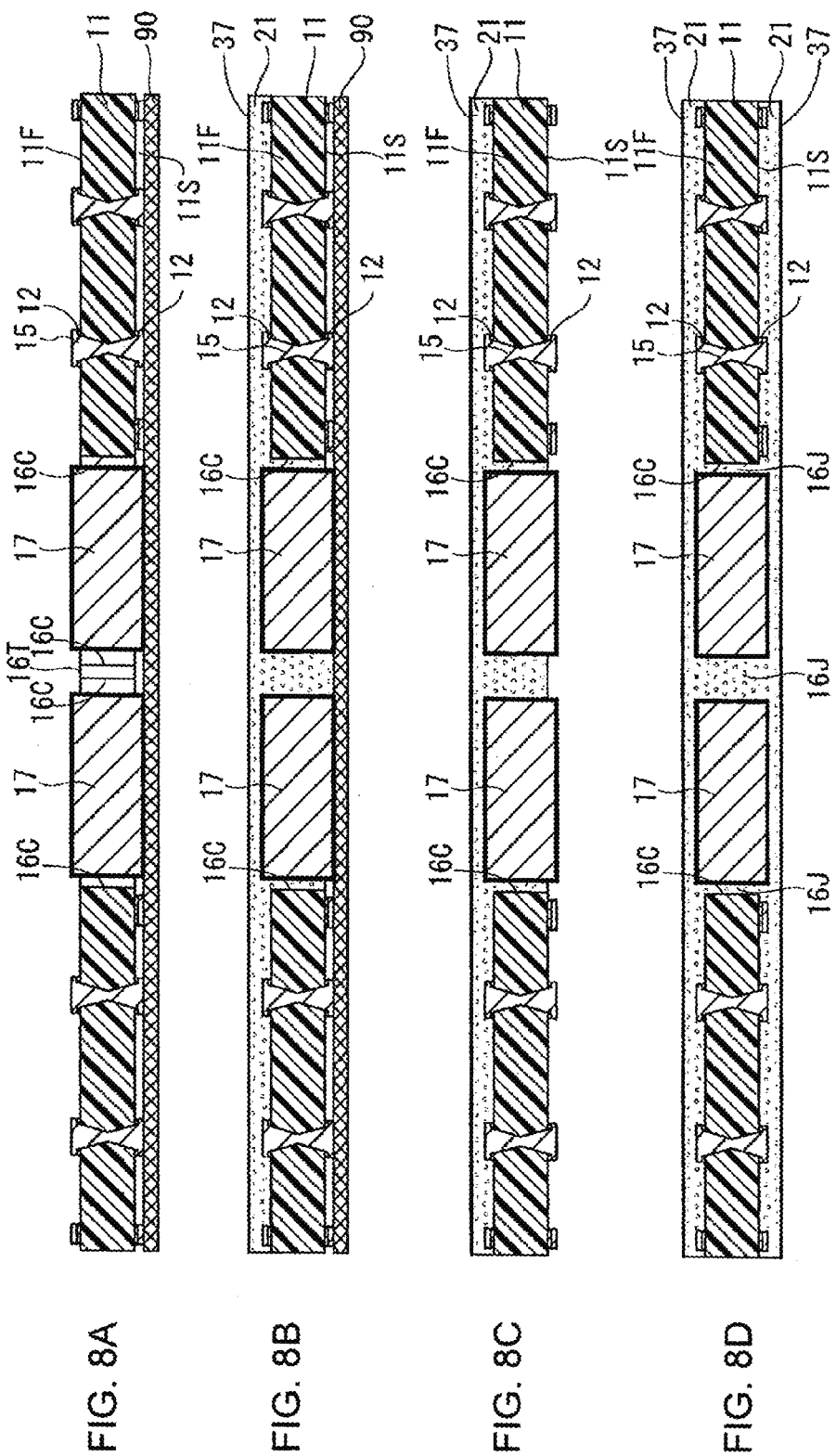

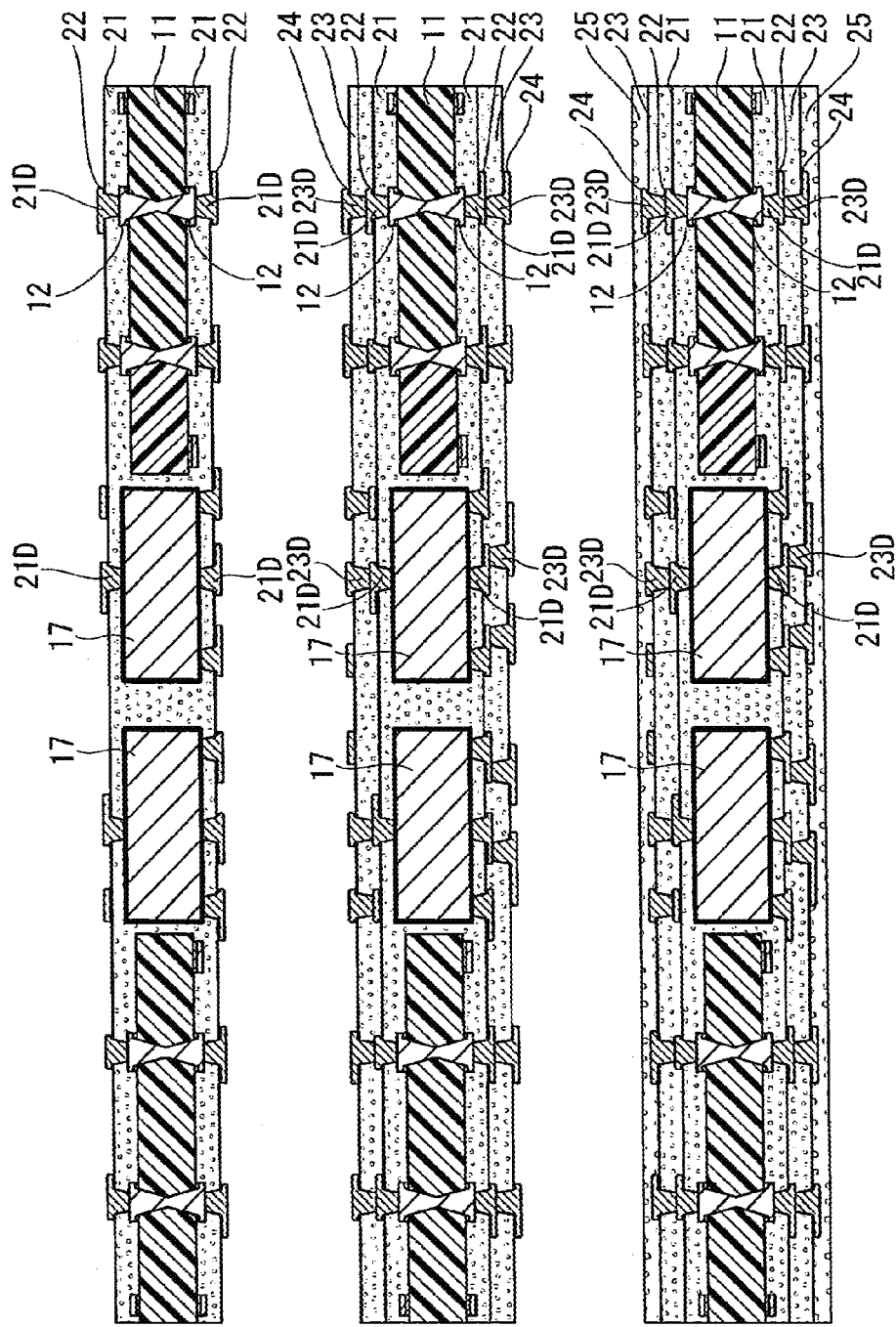

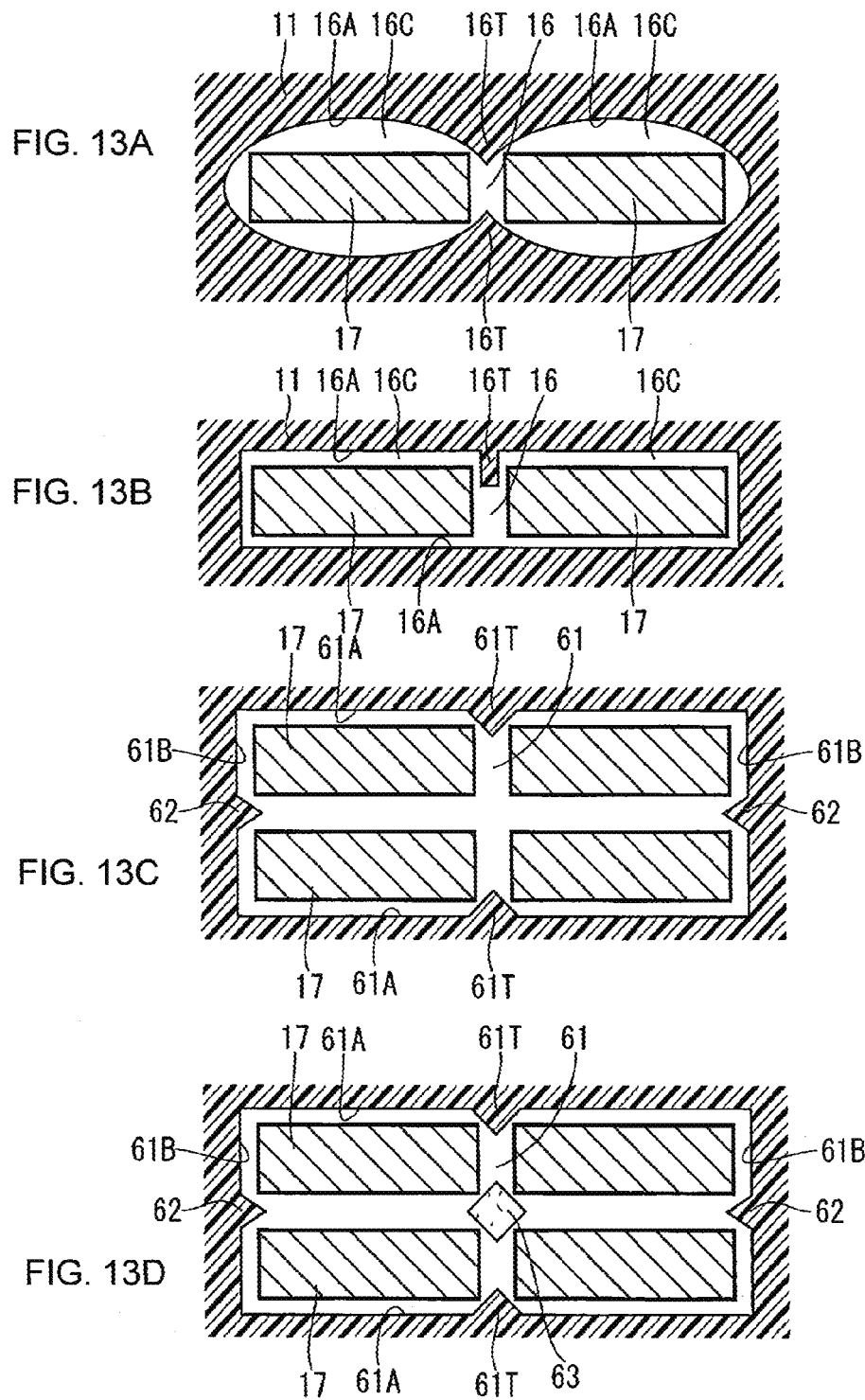

CIRCUIT SUBSTRATE AND METHOD FOR MANUFACTURING THE SAME

CROSS-REFERENCE TO RELATED APPLICATIONS

The present application is based upon and claims the benefit of priority to Japanese Patent Application No. 2014-137451, filed Jul. 3, 2014, the entire contents of which are incorporated herein by reference.

BACKGROUND OF THE INVENTION

1. Field of the Invention

The present invention relates to a circuit substrate in which a build-up layer is laminated on a core substrate that has a cavity, and to a method for manufacturing the circuit substrate.

2. Description of Background Art

Japanese Patent Laid-Open Publication No. 2013-135168 describes a circuit substrate in which a metal block is accommodated in a cavity. The entire contents of this publication are incorporated herein by reference.

SUMMARY OF THE INVENTION

According to one aspect of the present invention, a circuit substrate includes a core substrate having a cavity, multiple metal blocks accommodated in the cavity of the core substrate, a first build-up layer including an insulating resin layer and laminated on a first side of the core substrate such that the insulating resin layer is covering the cavity of the core substrate, a second build-up layer including an insulating resin layer and laminated on a second side of the core substrate such that the insulating resin layer is covering the cavity of the core substrate, and a filling resin filling a gap formed between the cavity and the metal blocks positioned in the cavity of the core substrate. The cavity of the core substrate is penetrating through the core substrate, the core substrate has an intracavity projection structure projecting from one or more side surfaces of the cavity such that the intracavity projection structure is positioned between the metal blocks and separating the metal blocks from contacting each other in the cavity of the core substrate, the first build-up layer has multiple first conductors connected to the metal blocks, respectively, such that each of the first conductors conducts one of electricity and heat, and the second build-up layer has multiple second conductors connected to the metal blocks, respectively, such that each of the second conductors conducts one of electricity and heat.

According to another aspect of the present invention, a method for manufacturing a circuit substrate includes forming a core substrate such that the core substrate has a cavity penetrating through the core substrate and an intracavity projection structure projecting from one or more side surfaces of the cavity, accommodating multiple metal blocks in the cavity of the core substrate such that the intracavity projection structure is positioned between the metal blocks and separating the metal blocks from contacting each other in the cavity of the core substrate, forming a first build-up layer including an insulating resin layer on a first side of the core substrate such that the insulating resin layer covers the cavity of the core substrate, forming a second build-up layer including an insulating resin layer on a second side of the core substrate such that the insulating resin layer covers the cavity of the core substrate, and filling a filling resin into a gap formed between the cavity and the metal blocks such that the metal blocks are positioned in the cavity of the core substrate. The forming of the first build-up layer includes forming multiple first conductors connected to the metal blocks, respectively, such that each of the first conductors conducts one of electricity and heat, and the forming of the second build-up layer includes forming multiple second conductors connected to the metal blocks, respectively, such that each of the second conductors conducts one of electricity and heat.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8A-8D are cross-sectional side views illustrating manufacturing processes of the circuit substrate;

FIG. 10A-10C are cross-sectional side views illustrating manufacturing processes of the circuit substrate;

FIG. 13A-13D are partial plan views of core substrates of other embodiments.

DETAILED DESCRIPTION OF THE EMBODIMENTS

Figure 1:
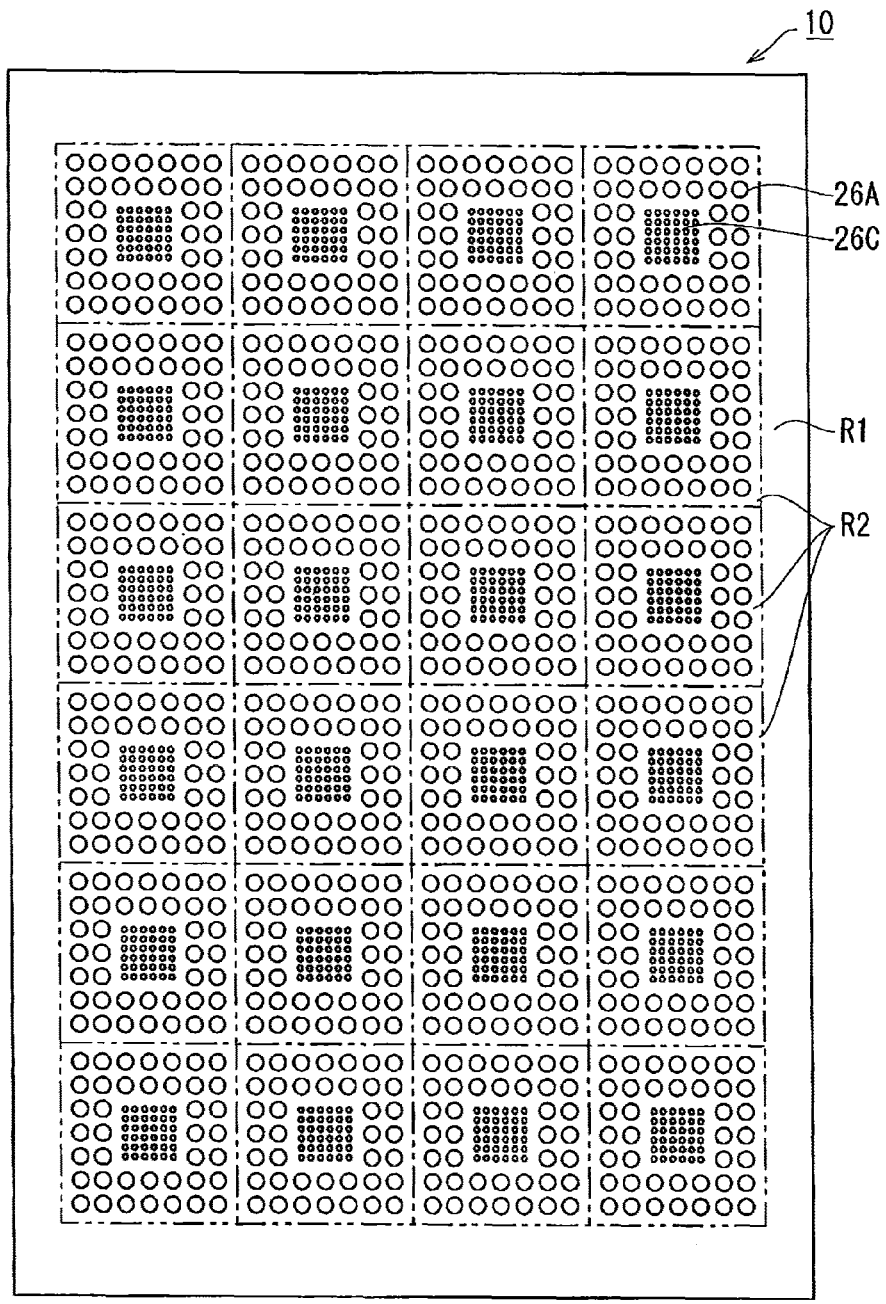
FIG. 1 is a plan view of a circuit substrate according to an embodiment of the present invention.

The embodiments will now be described with reference to the accompanying drawings, wherein like reference numerals designate corresponding or identical elements throughout the various drawings.

Figure 2:
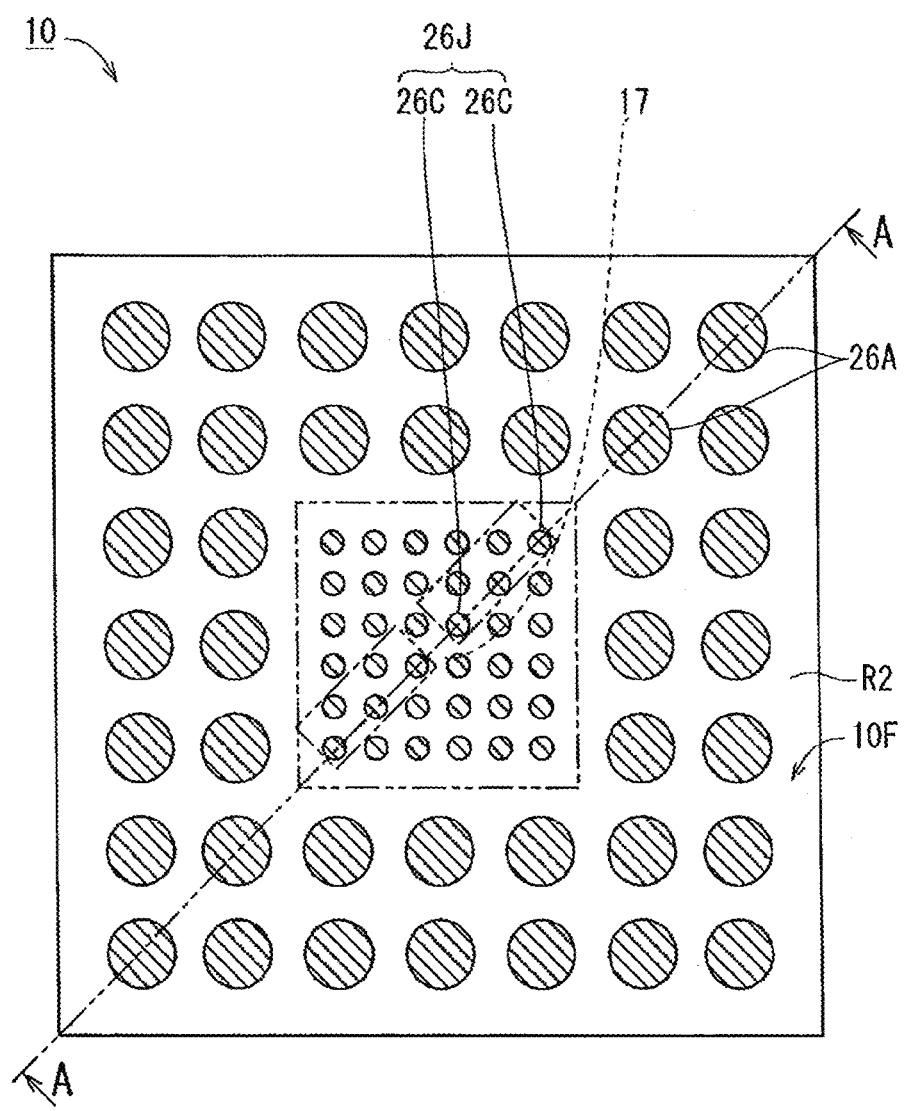
FIG. 2 is a plan view of a product region in the circuit substrate.
Figure 3:
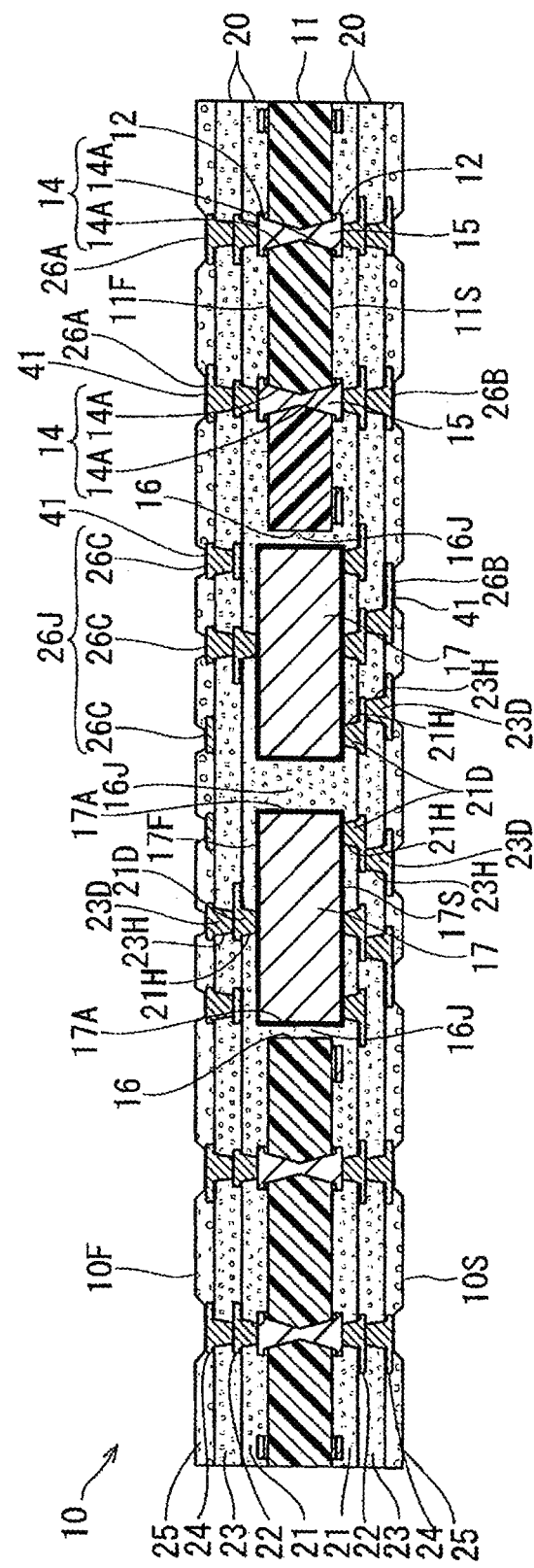
FIG. 3 is cross-sectional side view of the circuit substrate in an A-A cutting plane of FIG. 2.

In the following, an embodiment of the present invention is described based on FIG. 1-12. As illustrated in a plan view of FIG. 1, a circuit substrate 10 of the present embodiment has, for example, a frame-shaped discard region (R1) along an outer edge, and an inner side of the discard region (R1) is divided into multiple square product regions (R2). FIG. 2 illustrates an enlarged view of one product region (R2). FIG. 3 illustrates an enlarged view of a cross-sectional structure of the circuit substrate 10, the cross section being taken by cutting the product region (R2) along a diagonal line.

As illustrated in FIG. 3, the circuit substrate 10 is structured to have build-up layers (20, 20) on both front and back surfaces of a core substrate 11. The core substrate 11 is formed of an insulating member. A conductor circuit layer 12 is formed on each of an F surface (11F), which is the front side surface of the core substrate 11, and an S surface (11S), which is the back side surface of the core substrate 11. Further, a cavity 16 and multiple electrical conduction through holes 14 are formed in the core substrate 11.

The electrical conduction through holes 14 are each formed in a middle-constricted shape in which small diameter side ends of tapered holes (14A, 14A) are communicatively connected, the tapered holes (14A, 14A) being respective formed by drilling from the F surface (11F) and the S surface (11S) of the core substrate 11 and being gradually reduced in diameter toward a deep side. On the other hand, the cavity 16 is formed in a shape that has a space in a shape of a rectangular cuboid.

The electrical conduction through holes 14 are filled with plating and multiple through-hole electrical conductors 15 are respectively formed. The conductor circuit layer 12 on the F surface (11F) and the conductor circuit layer 12 on the S surface (11S) are connected by the through-hole electrical conductors 15.

Figure 4:
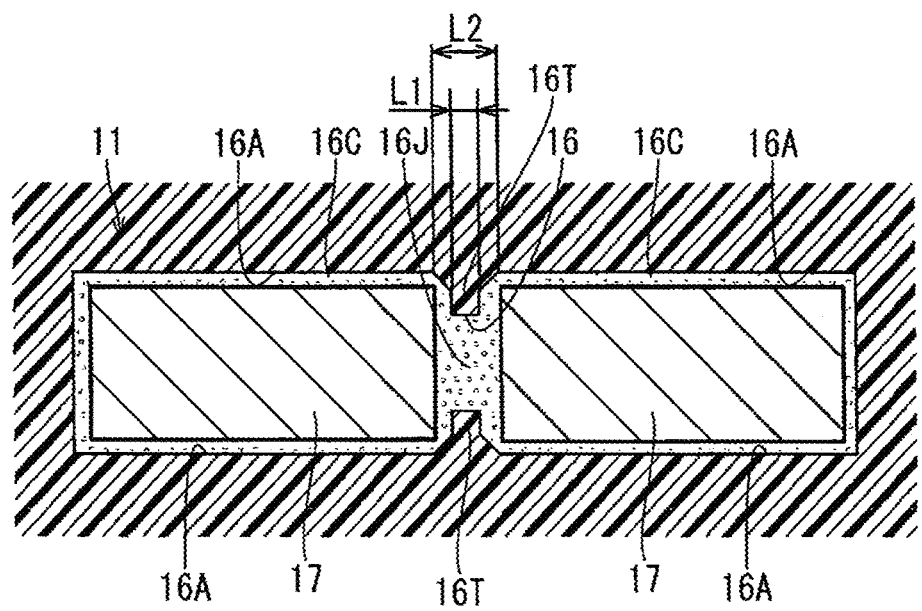
FIG. 4 is a partial plan view of a core substrate.
Figure 5:
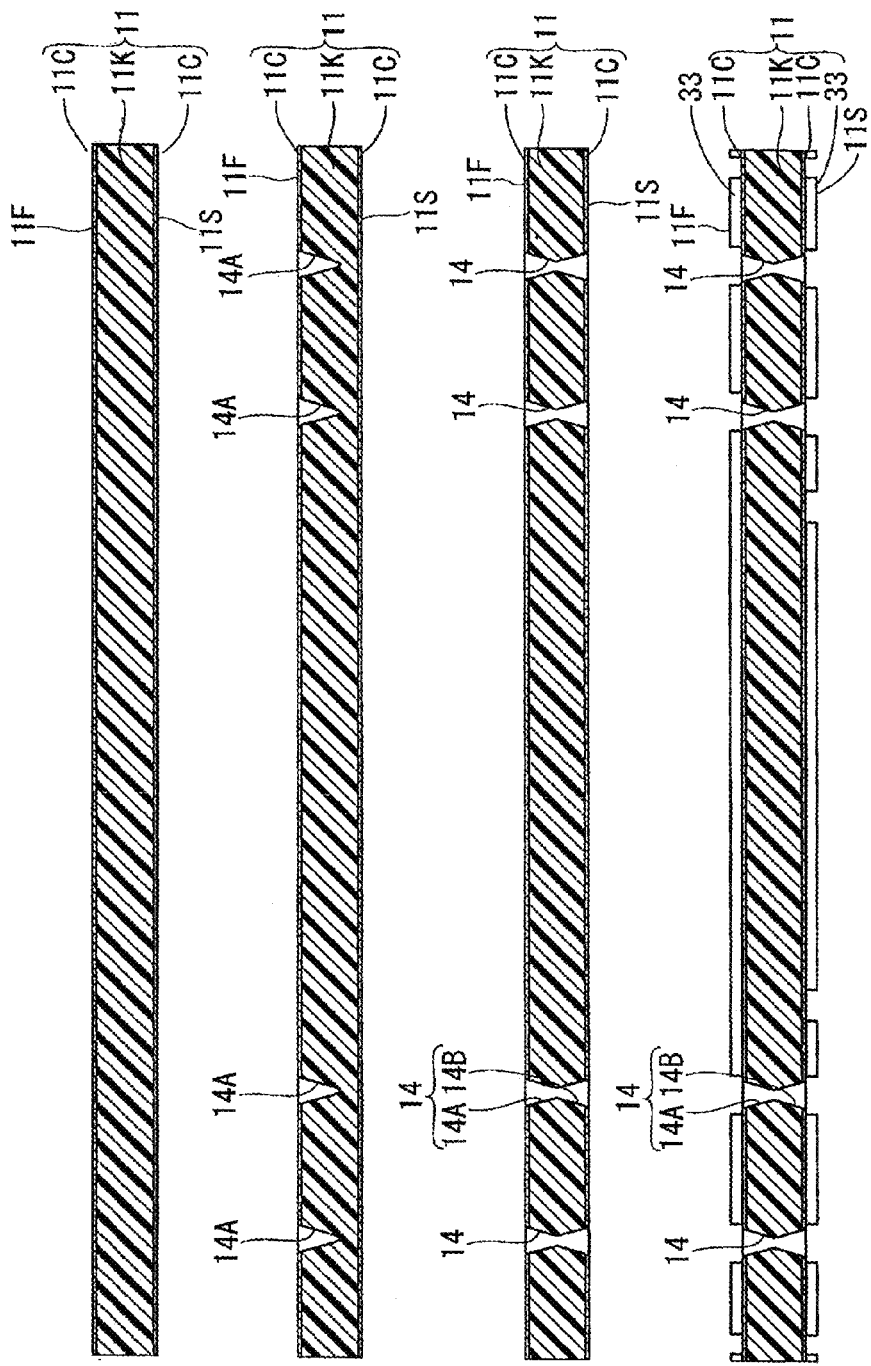
FIG. 5A-5D are cross-sectional side views illustrating manufacturing processes of the circuit substrate.
Figure 6:
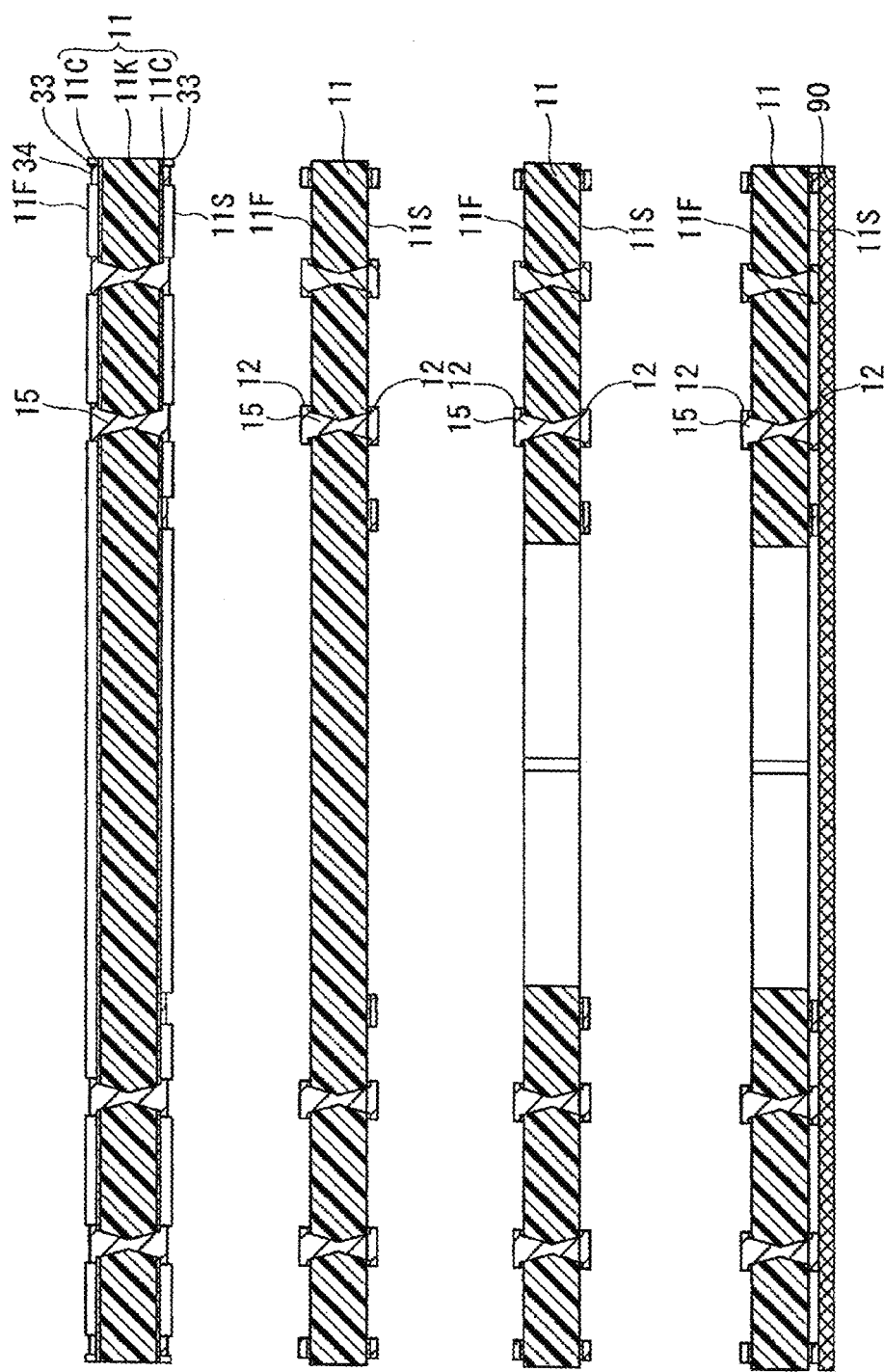
FIG. 6A-6D are cross-sectional side views illustrating manufacturing processes of the circuit substrate.

As illustrated in FIG. 4, the cavity 16 includes a pair of intracavity projections (16T, 16T) that extend on a straight line at a center in a longitudinal direction of the cavity 16. The intracavity projections (16T, 16T) project in a manner approaching each other from a pair of inner side surfaces (16A, 16A) that oppose each other in a width direction of the cavity 16, and extend in a plate thickness direction of the core substrate 11. Specifically, the intracavity projection (16T) is formed in a shape that, when viewed in the plate thickness direction of the core substrate 11, rises from the inner side surface (16A) and has a width that is gradually reduced up to the middle in a direction toward a front end side and is constant from the middle to the front end. A width (L1) of a front end part of the intracavity projection (16T) is 10 μm-40 μm; a width (L2) of a bottom part is at least 70 μm, and a projection amount of the intracavity projection (16T) from the inner side surface (16A) of the cavity 16 to the front end of the intracavity projection (16T) is 120 μm-170 μm.

The cavity 16 is partitioned into two accommodating parts (16C, 16C) by the above-described pair of intracavity projections (16T, 16T). Each of the accommodating parts (16C) is formed in a rectangular shape that extends in the longitudinal direction of the cavity 16. A metal block 17 is accommodated in each of the accommodating parts (16C). Each of the metal blocks 17 is, for example, a copper cuboid. A planar shape of each of the metal blocks 17 is slightly smaller than a planar shape of each of the accommodating parts (16C).

Further, as illustrated in FIG. 3, a thickness of each of the metal blocks 17, that is, a distance between a first primary surface (17F) (which is one of front and back surfaces of each of the metal blocks 17) and a second primary surface (17S) (which is the other one of the front and back surfaces of each of the metal blocks 17), is slightly larger than a plate thickness of the core substrate 11. The metal blocks 17 each slightly protrude from both the F surface (11F) and the S surface (11S) of the core substrate 11. The first primary surface (17F) of each of the metal blocks 17 is substantially flush with an outermost surface of the conductor circuit layer 12 on the F surface (11F) of the core substrate 11, and the second primary surface (17S) of each of the metal blocks 17 is substantially flush with an outermost surface of the conductor circuit layer 12 on the S surface (11S) of the core substrate 11. Further, a gap in the cavity 16 is filled with a filling resin (16J) according to an embodiment of the present invention.

The first primary surface (17F) and the second primary surface (17S) of each of the metal blocks 17, and four side surfaces (17A) between the first primary surface (17F) and second primary surface (17S) (that is, all outer surfaces of each of the metal blocks 17) are roughened surfaces. Specifically, the metal blocks 17 are each immersed in an acid solution (for example, an acid of which main components are sulfuric acid and hydrogen peroxide) for a predetermined time period to erode the surfaces and thereby the surfaces of each of the metal blocks 17 have an arithmetic average roughness (Ra) of 0.1 μm-3.0 μm (according to a definition of JIS B 0601-1994).

Both the build-up layer 20 on the F surface (11F) side of the core substrate 11 and the build-up layer 20 on the S surface (11S) side are formed by sequentially laminating, from the core substrate 11 side, a first insulating resin layer 21, a first conductor layer 22, a second insulating resin layer 23 and a second conductor layer 24. A solder resist layer 25 is laminated on the second conductor layer 24. Further, multiple via holes (21H) and multiple via holes (23H) are respectively formed in the first insulating resin layer 21 and the second insulating resin layer 23. The via holes (21H, 23H) are all formed in a tapered shape that is gradually reduced in diameter toward the core substrate 11 side. Further, the via holes (21H, 23H) are filled with plating and multiple via conductors (21D, 23D) are formed. Then, the conductor circuit layer 12 and the first conductor layer 22, and, the metal blocks 17 and the first conductor layer 22, are connected by the via conductors (21D) of the first insulating resin layer 21; and the first conductor layer 22 and the second conductor layer 24 are connected by the via conductors (23D) of the second insulating resin layer 23. Further, multiple pad holes are formed in the solder resist layer 25, and a portion of the second conductor layer 24 positioned in each of the pad holes becomes a pad 26.

On an F surface (10F) of the circuit substrate 10 (the F surface (10F) being an outermost surface of the build-up layer 20 on the F surface (11F) of the core substrate 11), the pads 26 include a group of large pads (26A) that are arranged in two rows along an outer edge of the product region (R2) and a group of small pads (26C) that are arranged in multiple vertical and horizontal rows in an inner side region surrounded by the group of the large pads (26A). Further, an electronic component mounting part (26J) according to an embodiment of the present invention is formed from the group of the small pads (26C). Further, for example, as illustrated in FIG. 2, the pair of the metal blocks (17, 17) are respectively arranged at a position directly below a total of five small pads (26C) including three small pads (26C) that are aligned on one end side on a diagonal line of the electronic component mounting part (26J) and two small pads (26C) that are aligned parallel to the diagonal line next to the three small pads (26C), and at a position directly below a total of five small pads (26C) including three small pads (26C) that are aligned on the other end side on the diagonal line of the electronic component mounting part (26J) and two small pads (26C) that are aligned parallel to the diagonal line next to the three small pads (26C). Then, among the five small pads (26C), as illustrated in FIG. 3, for example, one small pad (26C) is connected via two via conductors (21D, 23D) to the first metal block 17 on a left side in FIG. 3; and, for example, one small pad (26C) is connected via two via conductors (21D, 23D) to the second metal block 17 on a right side in FIG. 3. In contrast, on an S surface (10S) of the circuit substrate 10 (the S surface (10S) being an outermost surface of the build-up layer 20 on the S surface (11S) of the core substrate 11), for example, three medium pads (26B) that are larger than the small pads (26C) form a substrate connecting part according to an embodiment of the present invention. Among the medium pads (26B), two medium pads (26B) are connected via four via conductors (21D, 23D) to the first metal block 17, and two medium pads (26B) are connected via four via conductors (21D, 23D) to the second metal block 17. That is, in the circuit substrate 10 of the present embodiment, the number of the via conductors (21D) that are connected to each of the metal blocks 17 is greater in the build-up layer 20 on the S surface (11S) side of the core substrate 11 than in the build-up layer 20 on the F surface (11F) side.

The circuit substrate 10 of the present embodiment is manufactured as follows.

(1) As illustrated in FIG. 5A, a substrate as the core substrate 11 is prepared that is obtained by laminating a copper foil (11C) on each of both front and back surfaces of an insulating base material (11K) that is made of epoxy resin or BT (bismaleimide triazine) resin and a reinforcing material such as a glass cloth.

(2) As illustrated in FIG. 5B, the tapered holes (14A) for forming the electrical conduction through holes 14 (see FIG. 3) are drilled by irradiating, for example, CO2 laser to the core substrate 11 from the F surface (11F) side.

(3) As illustrated in FIG. 5C, the tapered holes (14A) are drilled on the S surface (11S) side of the core substrate 11 by irradiating CO2 laser to positions directly on the back of the above-described tapered holes (14A) on the F surface (11F) side. The electrical conduction through holes 14 are formed from the tapered holes (14A, 14A).

(4) An electroless plating treatment is performed. An electroless plating film (not illustrated in the drawings) is formed on the copper foil (11C) and on inner surfaces of the electrical conduction through holes 14.

(5) As illustrated in FIG. 5D, a plating resist 33 of a predetermined pattern is formed on the electroless plating film on the copper foil (11C).

(6) An electrolytic plating treatment is performed. As illustrated in FIG. 6A, the electrical conduction through holes 14 are filled with electrolytic plating and the through-hole electrical conductors 15 are formed; and an electrolytic plating film 34 is formed on a portion of the electroless plating film (not illustrated in the drawings) on the copper foil (11C), the portion being exposed from the plating resist 33.

(7) The plating resist 33 is peeled off, and the electroless plating film (not illustrated in the drawings) and the copper foil (11C), which are below the plating resist 33, are removed. As illustrated in FIG. 6B, by the remaining electrolytic plating film 34, electroless plating film and copper foil (11C), the conductor circuit layer 12 is formed on the F surface (11F) of the core substrate 11, and the conductor circuit layer 12 is formed on the S surface (11S) of the core substrate 11. Then, the conductor circuit layer 12 on the F surface (11F) and the conductor circuit layer 12 on the S surface (11S) are in a state of being connected by the through-hole electrical conductors 15.

Figure 7:
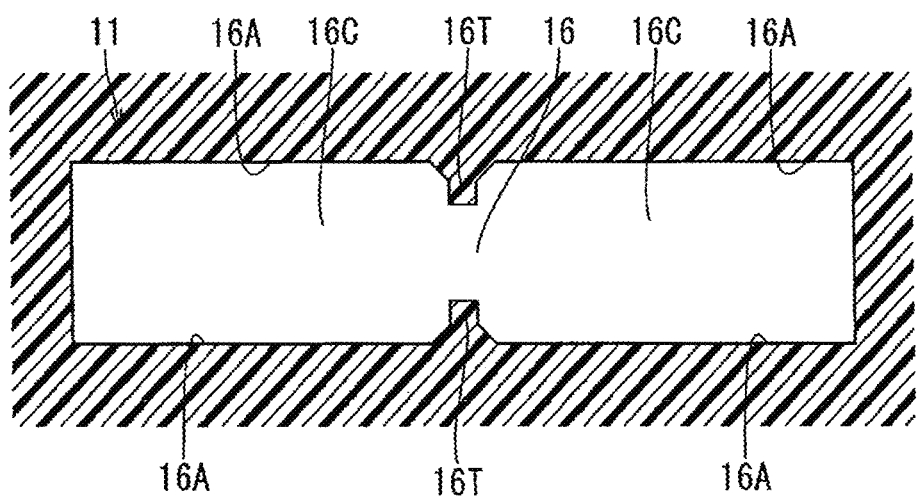
FIG. 7 is a partial plan view of the core substrate.

(8) As illustrated in FIG. 6C, the cavity 16 is formed in the core substrate 11 using a router or CO2 laser. The cavity 16 has a substantially rectangular cross section and penetrates through the core substrate 11 in the thickness direction. Specifically, as illustrated in FIG. 7, the cavity 16 is formed by cutting the core substrate 11 in a rectangular shape such that a central portion in the longitudinal direction of the inner side surfaces (16A, 16A) is gradually reduced in width. The projecting parts of the core substrate 11 that make the central portion of the cavity 16 in the longitudinal direction reduced in width become the intracavity projections (16T, 16T). Then, due to the intracavity projections (16T, 16T), the cavity 16 is formed in a state of being partitioned into the two accommodating parts (16C, 16C).

(9) As illustrated in FIG. 6D, a tape 90 made of a PET film is affixed to the S surface (11S) of the core substrate 11 so as to close the cavity 16.

(10) The metal blocks 17 are prepared. The metal blocks 17 are each formed by cutting a copper plate or a copper block. In a state of being accommodated in a container having an acid resistant mesh structure, each of the metal blocks 17 is immersed in an acid solution (for example, an acid of which main components are sulfuric acid and hydrogen peroxide) stored in a storage tank and thereafter is washed with water. As a result, the entire surface of each of the metal blocks 17 becomes a roughened surface.

(11) As illustrated in FIG. 8A, the two metal blocks (17, 17) are respectively accommodated in the two accommodating parts (16C, 16C) of the cavity 16 using a mounter (not illustrated in the drawings).

(12) As illustrated in FIG. 8B, a prepreg (a resin sheet of a B-stage formed by impregnating a core material with resin) as the first insulating resin layer 21 and a copper foil 37 are laminated on the conductor circuit layer 12 on the F surface (11F) of the core substrate 11, and then, the resulting substrate is thermo-pressed. In doing so, spacing between the conductor circuit layers (12, 12) on the F surface (11F) of the core substrate 11 is filled with the prepreg, and gaps in the cavity 16 are filled with thermosetting resin exuding from the prepreg.

(13) As illustrated in FIG. 8C, the tape 90 is removed.

(14) As illustrated in FIG. 8D, a prepreg as the first insulating resin layer 21 and a copper foil 37 are laminated on the conductor circuit layer 12 on the S surface (11S) of the core substrate 11, and then, the resulting substrate is thermo-pressed. In doing so, spacing between the conductor circuit layers (12, 12) on the S surface (11S) of the core substrate 11 is filled with the prepreg, and gaps in the cavity 16 are filled with thermosetting resin exuding from the prepreg. Further, the above-described filling resin (16J) is formed by the thermosetting resin that exudes from the prepregs on the F surface (11F) and the S surface (11S) of the core substrate 11 and is filled in the gaps in the cavity 16.

Instead of the prepreg, it is also possible to use a resin film that does not contain a core material as the first insulating resin layer 21. In this case, without laminating a copper foil, a conductor circuit layer can be directly formed on a surface of the resin film using a semi-additive method.

Figures 9A, 9B, 9C:
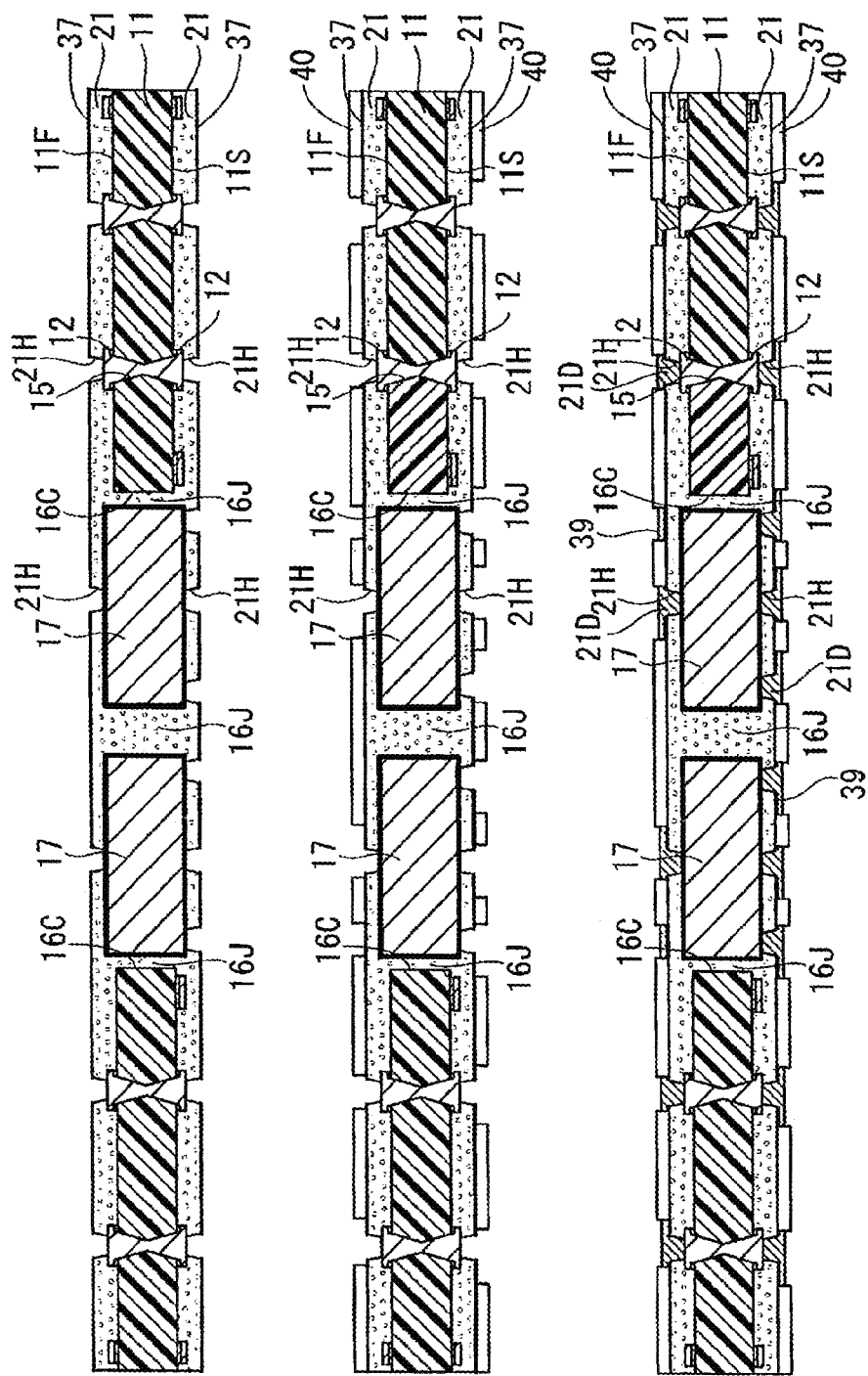
FIG. 9A-9C are cross-sectional side views illustrating manufacturing processes of the circuit substrate.

(15) As illustrated in FIG. 9A, multiple via holes (21H) are formed by irradiating CO2 laser to the first insulating resin layers (21, 21) that are respectively formed on the front and back sides of the core substrate 11 by the prepregs. Among the via holes (21H), some via holes (21H) are arranged on the conductor circuit layers 12 and other via holes (21H) are arranged on the metal blocks 17. When the via holes (21H) are formed on the metal blocks 17, unevenness of the roughened surfaces of the metal blocks 17 positioned on a deep side of the via holes (21H) may be eliminated by laser irradiation or by desmear after laser irradiation.

(16) An electroless plating treatment is performed. Electroless plating films (not illustrated in the drawings) are formed on the first insulating resin layers (21, 21) and in the via holes (21H, 21H).

(17) As illustrated in FIG. 9B, plating resists 40 of predetermined patterns are respectively formed on the electroless plating films on the copper foils 37.

(18) An electrolytic plating treatment is performed. As illustrated in FIG. 9C, the via holes (21H, 21H) are filled with plating and the via conductors (21D, 21D) are formed. Further, electrolytic plating films (39, 39) are formed on portions of the electroless plating films (not illustrated in the drawings) on the first insulating resin layers (21, 21), the portions being exposed from the plating resists 40.

(19) The plating resists 40 are removed, and the electroless plating films (not illustrated in the drawings) and the copper foils 37, which are below the plating resists 40, are removed. As illustrated in FIG. 10A, the first conductor layers 22 are respectively formed on the first insulating resin layers 21 on the front and back sides of the core substrate 11 by the remaining electrolytic plating films 39, electroless plating films and copper foils 37. Then, a state is achieved in which, on each of the front and back sides of the core substrate 11, a portion of the first conductor layer 22 and the conductor circuit layer 12 are connected by the via conductors (21D), and the other portion of the first conductor layer 22 and the metal blocks 17 are connected by the via conductors (21D).

(20) By the same processing as described in the above (12)-(19), as illustrated in FIG. 10B, a state is achieved in which, on each of the front and back sides of the core substrate 11, the second insulating resin layer 23 and the second conductor layer 24 are formed on the first conductor layer 22, and a portion of the second conductor layer 24 and the first conductor layer 22 are connected by the via conductors (23D).

(21) As illustrated in FIG. 10C, the solder resist layers (25, 25) are respectively laminated on the second conductor layers 24 on the front and back sides of the core substrate 11.

Figure 11:
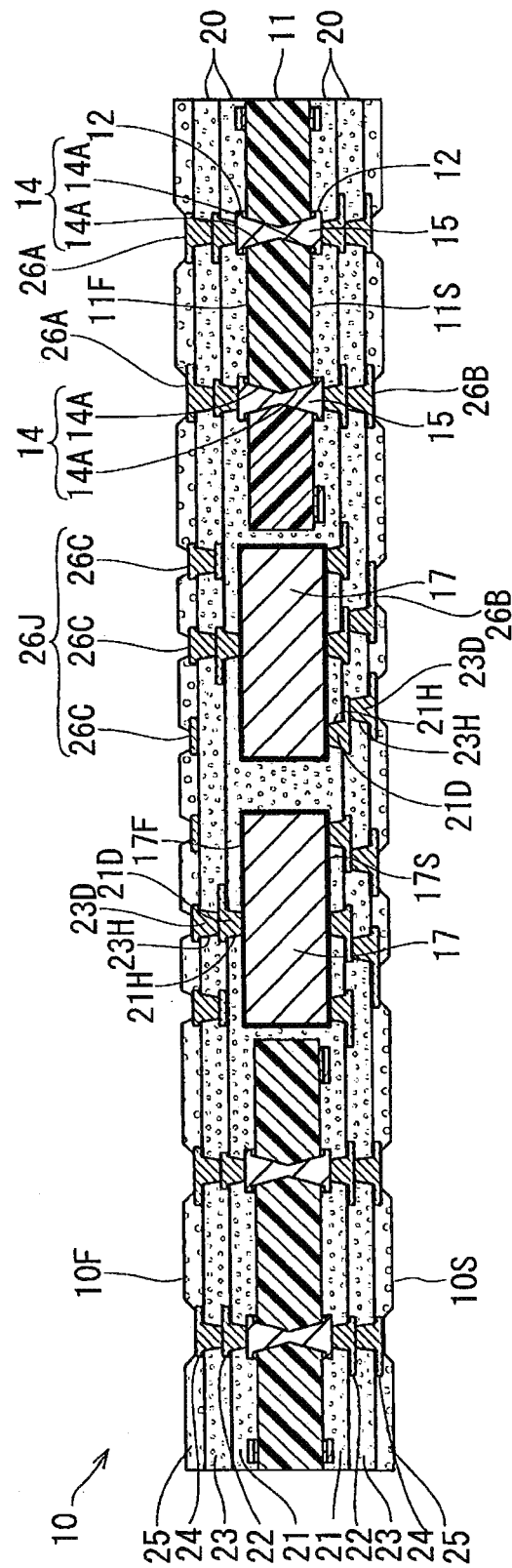
FIG. 11 is a cross-sectional side view illustrating a manufacturing process of the circuit substrate.

(22) As illustrated in FIG. 11, tapered pad holes are formed at predetermined places on the solder resist layers (25, 25) on the front and back sides of the core substrate 11, and portions of the second conductor layers 24 on the front and back sides of the core substrate 11 that are exposed from the pad holes become the pads 26.

(23) On each of the pads 26, a nickel layer, a palladium layer and a gold layer are laminated in this order and a metal film 41 illustrated in FIG. 3 is formed. As a result, the circuit substrate 10 is completed.

The description about the structure and the manufacturing method of the circuit substrate 10 of the present embodiment is as given above. Next, an operation effect of the circuit substrate 10 is described. In circuit substrate 10 of the present embodiment, as described above, the metal blocks 17 are accommodated in the common cavity 16. Therefore, as compared to the case where the metal blocks are accommodated in separate cavities 16, the metal blocks 17 can be collectively arranged at one place. In addition, the cavity 16 is partitioned into the accommodating parts (16C, 16C) that correspond to the metal blocks 17 by the intracavity projections (16T) that project from the inner side surfaces (16A) of the cavity 16. Therefore, the process in which the metal blocks (17, 17) are accommodated in a state of being separated from each other can be efficiently performed.

Figure 12:
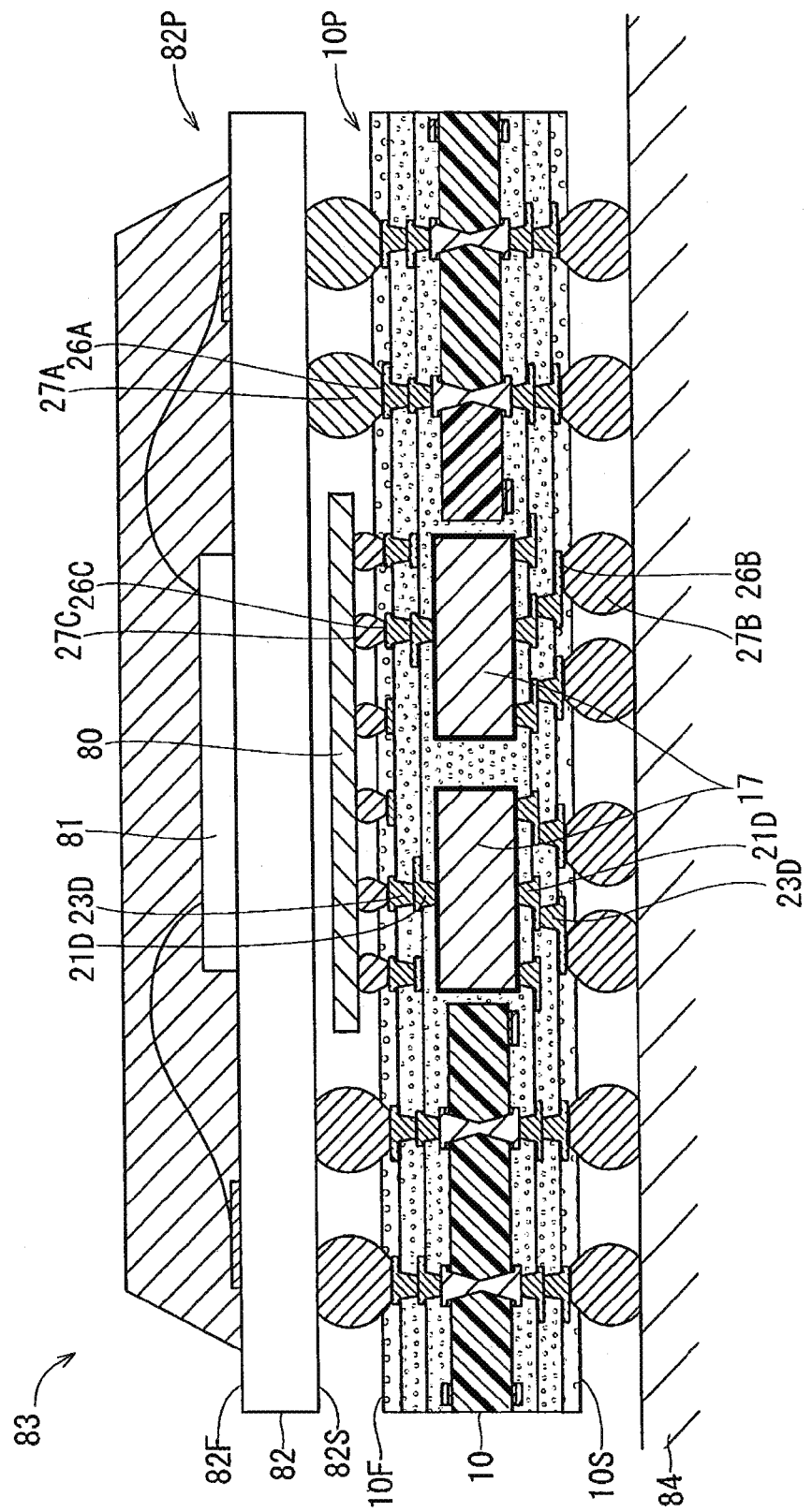
FIG. 12 is a cross-sectional side view of a PoP that includes the circuit substrate.

An example of use of the circuit substrate 10 of the present embodiment is as follows. The circuit substrate 10 of the present embodiment is used, for example, as follows. That is, as illustrated in FIG. 12, large, medium and small solder bumps (27A, 27B, 27C) that respective match the sizes of the above-described large, medium and small pads (26A, 26B, 26C) of the circuit substrate 10 are respectively formed on the large, medium and small pads (26A, 26B, 26C). Then, for example, a CPU 80 having on a lower surface a pad group that is similarly arranged as the small pad group on the F surface (10F) of the circuit substrate 10 is mounted on and soldered to the group of the small solder bumps (27C) of each product region (R2), and a first package substrate (10P) is formed. In this case, for example, one pad for grounding that the CPU 80 has is connected via the via conductors (21D, 23D) to the first metal block 17 of the circuit substrate 10 and, for example, one pad for heat dissipation that is CPU 80 has is connected via the via conductors (21D, 23D) to the second metal block 17 of the circuit substrate 10.

Next, a second package substrate (82P) that is obtained by mounting a memory 81 on an F surface (82F) of a circuit substrate 82 is arranged from an upper side of the CPU 80 on the first package substrate (10P). The large solder bumps (27A) of the circuit substrate 10 of the first package substrate (10P) are soldered to pads that are provided on an S surface (82S) of the circuit substrate 82 of the second package substrate (82P). Thereby, a PoP 83 (Package on Package 83) is formed. Gaps between the circuit substrates (10, 82) in the PoP 83 are filled with resin (not illustrated in in the drawings).

Next, the PoP 83 is arranged on a motherboard 84. The medium solder bumps (27B) on the circuit substrate 10 of the PoP 83 are soldered to a pad group that the motherboard 84 has. In this case, a pad for grounding that the motherboard 84 has is soldered to the pad 26 of the circuit substrate 10 that is connected to the first metal block 17, and a pad for dissipation that the motherboard 84 has is soldered to the pad 26 of the circuit substrate 10 that is connected to the second metal block 17.

When the CPU 80 generates heat, the heat is transmitted to the two metal blocks 17 via the via conductors (21D, 23D) contained in the build-up layer 20 on the F surface (10F) side of the circuit substrate 10 on which the CPU 80 is mounted, and is dissipated from the two metal blocks 17 to the motherboard 84 via the via conductors (21D, 23D) contained in the build-up layer 20 on the S surface (10S) side of the circuit substrate 10. Further, the first metal block 17 is used not only as a heat transmission path but also as a ground electrical conduction path. Here, in the circuit substrate 10 of the present embodiment, the number of the via conductors (21D) that are connected to each of the metal blocks 17 is greater in the build-up layer 20 on the S surface (11S) side, to which the motherboard 84 as a heat dissipation destination is connected, than in the build-up layer 20 on the F surface (10F) side, on which the CPU 80 is mounted. Therefore, heat accumulation in each of the metal blocks 17 can be suppressed, and heat dissipation can be efficiently performed.

However, the circuit substrate 10 repeats thermal expansion and contraction due to use and non-use of the CPU 80. Then, due to a difference in thermal expansion coefficients of each of the metal blocks 17 and the first insulating resin layer 21 of the build-up layer 20, a shear force acts between each of the metal blocks 17 and the first insulating resin layer 21 of the build-up layer 20, and there is a concern that the first insulating resin layer 21 and the via conductors (21D) may peel off from each of the metal blocks 17. However, in the circuit substrate 10 of the present embodiment, both the front and back surfaces (the first primary surface (17F) and the second primary surface (17S)) of each of the metal blocks 17 that are covered by the first insulating resin layers (21, 21) are formed as roughened surfaces. Therefore, peeling between each of the metal blocks 17 and the first insulating resin layers (21, 21) can be suppressed, and the fixation of each of the metal blocks 17 in the circuit substrate 10 can be stabilized. Further, the side surfaces (17A) of each of the metal blocks 17 are also formed as roughened surfaces. Therefore, fixation of each of the metal blocks 17 is also stabilized in the plate thickness direction of the circuit substrate 10. Further, by forming the surfaces of each of the metal blocks 17 as roughened surfaces, a contact area between each of the metal blocks 17 and the first insulating resin layers (21, 21) and the filling resin (16J) in the cavity 16 is increased, and efficiency of heat dissipation from each of the metal blocks 17 to the circuit substrate 10 is increased.

Other Embodiments

The present invention is not limited to the above-described embodiment. For example, an embodiment described below is also included in the technical scope of the present invention. Further, in addition to the embodiment described below, the present invention can also be embodied in various modified forms within the scope without departing from the spirit of the present invention.

(1) The planar shape of each of the accommodating parts (16C) of the cavity 16 of the above embodiment forms a quadrangular shape corresponding to the planar shape of each of the metal blocks 17. However, it is also possible that the planar shape of each of the accommodating parts is different from the planar shape of each of the metal blocks. Specifically, as in a case of a cavity 60 illustrated in FIG. 13A, it is also possible that the accommodating parts (16C) are each formed in an elliptical shape and form a shape in which one long-axis end of one elliptical shape and one long-axis end of the other elliptical shape are communicatively connected to each other, and the metal blocks 17 are respectively accommodated in the accommodating parts (16C).

(2) In the cavity 16 of the above embodiment, the pair of intracavity projections (16T, 16T) project from the pair of opposing inner side surfaces (16A, 16A) in a manner approaching each other. However, as illustrated in FIG. 13B, it is also possible to have a structure in which one intracavity projection (16T) projects from only one of the inner side surfaces (16A).

(3) The intracavity projections (16T) of the cavity 16 of the above embodiment are structured to completely inhibit contact between the metal blocks (17, 17). However, as long as the contact between the metal blocks (17, 17) is regulated, it is also possible that the contact between the metal blocks (17, 17) is not completely inhibited. Specifically, as illustrated in FIG. 13C, it is also possible that, when four metal blocks 17 are accommodated and arranged in two rows and two columns in a cavity 61 having a rectangular planar shape, intracavity projections 62 are respectively provided at centers of long-side inner side surfaces (61A, 61A) of the cavity 61 and intracavity projections 62 are respectively provided at centers of short-side inner side surfaces (61B, 61B), and the intracavity projections 62 are each arranged between adjacent metal blocks (17, 17). As a result, when orientations of the metal blocks 17 in the cavity 61 are changed, the metal blocks (17, 17) can be in contact with each other. However, the contact between the metal blocks (17, 17) is regulated by the intracavity projections 62. Therefore, as compared to a cavity 61 in which the intracavity projections 62 are not provided, the metal blocks (17, 17) that are accommodated in the common cavity 61 can be efficiently separated from each other. In this case, as illustrated in FIG. 13D, it is also possible to have a structure in which, after the four metal blocks 17 are accommodated in the cavity 61, a partition member 63 is accommodated in the cavity 61 by inserting the partition member 63 in a center of the cavity 61 so that the contact between the metal blocks (17, 17) is completely inhibited by cooperation of the intracavity projections 62 and the partition member 63.

Figure 14A:
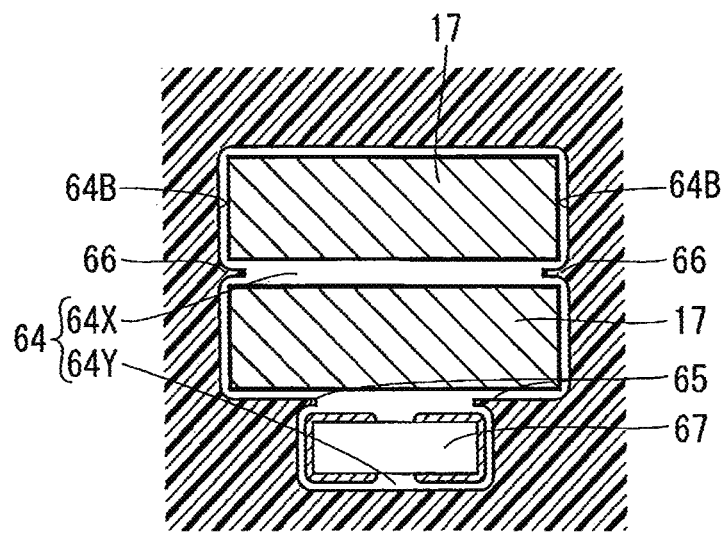
FIGS. 14A and 14B are partial plan views of core substrates of other embodiments.
Figure 14B:
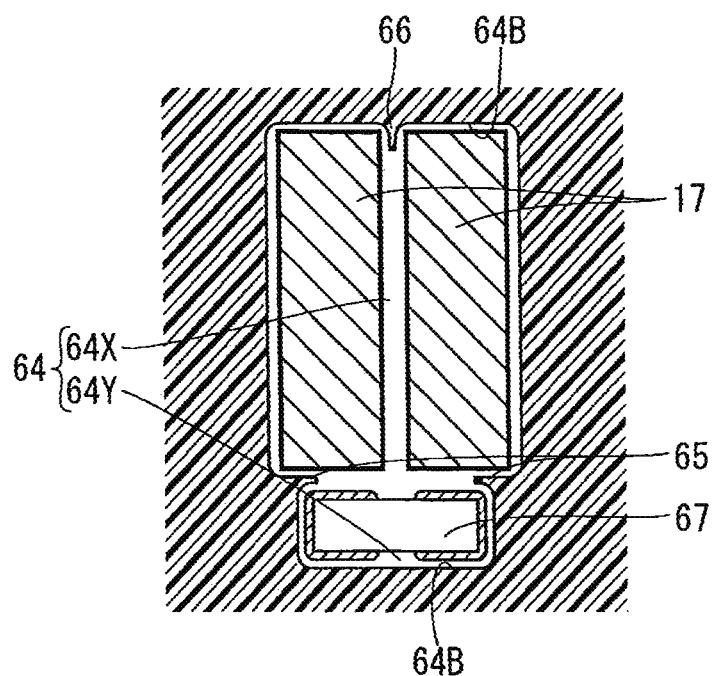

(4) Only the metal blocks 17 are accommodated in the cavity 16 of the above embodiment. However, together with the metal blocks (17, 17), an electronic component may also be accommodated in the cavity. Specifically, as illustrated in FIG. 14A, a cavity 64 may be formed to have a planar shape in which a small rectangular area (64Y) is communicatively connected to one of long sides of a large rectangular area (64X); a pair of intracavity projections (65, 65) may be provided so as to narrow a communication port of the large rectangular area (64X) and the small rectangular area (64Y); and further, intracavity projections (66, 66) may be respectively provided at centers of a pair of short-side inner side surfaces (64B, 64B) of the large rectangular area (64X). Then, the pair of metal blocks (17, 17) may be accommodated in the large rectangular area (64X) and contact between the metal blocks (17, 17) may be regulated by the intracavity projections (66, 66); a laminated ceramic capacitor 67 as an electronic component may be accommodated in the small rectangular area (64Y); and contact between the laminated ceramic capacitor 67 and the metal blocks 17 may be regulated by the intracavity projections (65, 65). Further, as illustrated in FIG. 14B, a cavity 64 may be formed to have a planar shape in which a small rectangular area (64Y) is communicatively connected to one of short sides of a large rectangular area (64X); a pair of intracavity projections (65, 65) may be provided so as to narrow a communication port of the large rectangular area (64X) and the small rectangular area (64Y); and further, an intracavity projection 66 may be provided at a center of a short-side inner side surface (64B) of the large rectangular area (64X), the short-side inner side surface (64B) being on an opposite side of the small rectangular area (64Y). A pair of metal blocks (17, 17) and a laminated ceramic capacitor 67 may be accommodated in the cavity 64. Instead of the laminated ceramic capacitor 67, other electronic components, for example, passive components such as a capacitor, a resistor, a thermistor and a coil, and active components such as an IC circuit, and the like, may also be accommodated in the cavity 64.

(5) In the above embodiment, the cavity 16 is formed by leaving the intracavity projection (16T) as a portion of the core substrate 11. However, it is also possible that, after the cavity 16 is formed, an intracavity projection (16T) that is a separate component, is fixed on the inner side surface (16A) of the cavity 16, and it is also possible that an intracavity projection (16T) is formed by applying an adhesive in a projecting shape on the inner side surface (16A) of the cavity 16.

(6) In the above embodiment, an example is described in which the pad for grounding of the CPU 80 is connected via the via conductors (21D, 23D) to the first metal block 17, and the pad for heat dissipation of the CPU 80 is connected via the via conductors (21D, 23D) to the second metal block 17. However, it is also possible that via conductors as conductor paths of different systems such those for grounding, for power source, for signals of different systems are respectively connected to the metal blocks.

(7) The via conductors (21D) of the above embodiment are in a state of being connected via the via conductors (23D) to the pads 26 that are exposed from the outermost surfaces of the circuit substrate 10. However, for example, it is also possible to have a state in which conductors that are connected to the via conductors (21D) are not connected to portions that are exposed from the outermost surfaces of the circuit substrate 10, such as a state in which the via conductors (23D) are not connected or the pads 26 are not provided.

(8) In the circuit substrate 10 of the above embodiment, the number of the via conductors (21D) that are connected to each of the metal blocks 17 is greater in the build-up layer 20 on the S surface (11S) side of the core substrate 11 than in the build-up layer 20 on the F surface (11F) side. However, it is also possible that the number of the via conductors (21D) is greater in the build-up layer 20 on the F surface (11F) side, or the number is the same in the build-up layers 20 on the two sides.

(9) The surfaces of each of the metal blocks 17 of the above embodiment are roughened after the copper plate or the copper block is cut. However, the surfaces may also be roughened before the cutting. In this case, all the side surfaces or portions of the side surfaces of each of the metal blocks 17 are in a state of being not roughened.

(10) The surfaces of each of the metal blocks of the above embodiment are roughened using an acid. However, for example, it is also possible that the roughening of the surfaces is performed by spraying particles or by pressing the surfaces against an uneven surface.

In a circuit substrate, it may be desirable that multiple metal blocks are collectively arranged at a predetermined place of the core substrate. However, a problem occurs that, when a cavity is separately provided for each of the metal blocks, a degree of integration is not improved; and when multiple metal blocks are accommodated in a common cavity, it takes time and effort to separate the metal blocks from each other in the cavity.

A circuit substrate according to an embodiment of the present invention is capable of efficiently separating from each other metal blocks that are accommodated in a common cavity, and another embodiment of the present invention is a method for manufacturing such a circuit substrate.

A circuit substrate according to one aspect of the present invention includes: a core substrate; a cavity that penetrates through the core substrate; multiple metal blocks that are accommodated in the common cavity and are separated from each other; build-up layers that are respectively laminated on front and back sides of the core substrate and each include an insulating resin layer that covers the cavity; conductor paths of multiple systems that are provided in the build-up layer and separately connected to the metal blocks to conduct electricity or to transmit heat; a filling resin that is filled in a gap in the cavity; and an intracavity projection that projects from a side surface of the cavity and is positioned between the metal blocks to regulate contact between the metal blocks.

Obviously, numerous modifications and variations of the present invention are possible in light of the above teachings. It is therefore to be understood that within the scope of the appended claims, the invention may be practiced otherwise than as specifically described herein.

What is claimed is:

1. A circuit substrate, comprising:
a core substrate having a cavity;
a plurality of metal blocks accommodated in the cavity of the core substrate;
a first build-up layer comprising an insulating resin layer and laminated on a first side of the core substrate such that the insulating resin layer is covering the cavity of the core substrate;
a second build-up layer comprising an insulating resin layer and laminated on a second side of the core substrate such that the insulating resin layer is covering the cavity of the core substrate; and
a filling resin filling a gap formed between the cavity and the metal blocks positioned in the cavity of the core substrate,
wherein the cavity of the core substrate is penetrating through the core substrate, the core substrate has an intracavity projection structure projecting from at least one side surface of the cavity such that the intracavity projection structure is positioned between the metal blocks and separating the metal blocks from contacting each other in the cavity of the core substrate, the first build-up layer has a plurality of first conductors connected to the plurality of metal blocks, respectively, such that each of the first conductors conducts one of electricity and heat, and the second build-up layer has a plurality of second conductors connected to the plurality of metal blocks, respectively, such that each of the second conductors conducts one of electricity and heat.

2. A circuit substrate according to claim 1, wherein the core substrate comprises an insulating base material forming the intracavity projection structure.

3. A circuit substrate according to claim 1, wherein the intracavity projection structure comprises a pair of intracavity projections projecting toward each other from opposite side surfaces of the cavity.

4. A circuit substrate according to claim 1, wherein the plurality of metal blocks comprises a first metal block connected to a first conductor path and a second metal block connected to a second conductor path which is a different conductor path from the first conductor path.

5. A circuit substrate according to claim 1, wherein at least one of the metal blocks has a plurality of roughened surfaces such that the roughened surfaces are in contact with the insulating resin layers in the first and second build-up layers on the first and second sides of the core substrate, respectively.

6. A circuit substrate according to claim 5, wherein the plurality of roughened surfaces is formed by eroding a plurality of surfaces of the at least one of the metal blocks with an acid.

7. A circuit substrate according to claim 1, further comprising:
an electronic component accommodated in the cavity of the core substrate,
wherein the core substrate has a second intracavity projection structure projecting from at least one side surface of the cavity such that the second intracavity projection structure is positioned between the electronic component and the metal blocks and separating the electronic component and the metal blocks from contacting each other in the cavity of the core substrate.

8. A circuit substrate according to claim 1, further comprising:
a first via conductor structure formed in the insulating resin layer in the first build-up layer; and
a second via conductor structure formed in the insulating resin layer in the second build-up layer,
wherein the first build-up layer has an electronic component mounting portion configured to mount an electronic component on a surface of the first build-up layer, the second build-up layer has a substrate connecting portion configured to mount a second circuit substrate on a surface of the second build-up layer, and the second via conductor structure comprises a larger number of via conductors than the first via conductor structure.

9. A circuit substrate according to claim 1, wherein the filler resin comprises resin derived from at least one of the insulating resin layers in the first and second build-up layers.

10. A circuit substrate according to claim 3, wherein at least one of the metal blocks has a plurality of roughened surfaces such that the roughened surfaces are in contact with the insulating resin layers in the first and second build-up layers on the first and second sides of the core substrate, respectively.

11. A circuit substrate according to claim 3, further comprising:
an electronic component accommodated in the cavity of the core substrate,
wherein the core substrate has a second intracavity projection structure projecting from at least one side surface of the cavity such that the second intracavity projection structure is positioned between the electronic component and the metal blocks and separating the electronic component and the metal blocks from contacting each other in the cavity of the core substrate.

12. A circuit substrate according to claim 3, further comprising:
a first via conductor structure formed in the insulating resin layer in the first build-up layer; and
a second via conductor structure formed in the insulating resin layer in the second build-up layer,
wherein the first build-up layer has an electronic component mounting portion configured to mount an electronic component on a surface of the first build-up layer, the second build-up layer has a substrate connecting portion configured to mount a second circuit substrate on a surface of the second build-up layer, and the second via conductor structure comprises a larger number of via conductors than the first via conductor structure.

13. A method for manufacturing a circuit substrate, comprising:
forming a core substrate such that the core substrate has a cavity penetrating through the core substrate and an intracavity projection structure projecting from at least one side surface of the cavity;
accommodating a plurality of metal blocks in the cavity of the core substrate such that the intracavity projection structure is positioned between the metal blocks and separating the metal blocks from contacting each other in the cavity of the core substrate;
forming a first build-up layer comprising an insulating resin layer on a first side of the core substrate such that the insulating resin layer covers the cavity of the core substrate;
forming a second build-up layer comprising an insulating resin layer on a second side of the core substrate such that the insulating resin layer covers the cavity of the core substrate; and
filling a filling resin into a gap formed between the cavity and the metal blocks such that the plurality of metal blocks is positioned in the cavity of the core substrate,
wherein the forming of the first build-up layer comprises forming a plurality of first conductors connected to the plurality of metal blocks, respectively, such that each of the first conductors conducts one of electricity and heat, and the forming of the second build-up layer comprises forming a plurality of second conductors connected to the plurality of metal blocks, respectively, such that each of the second conductors conducts one of electricity and heat.

14. A method for manufacturing a circuit substrate according to claim 13, wherein the forming of the core substrate comprises removing a portion of the core substrate such that the cavity and the intracavity projection structure are formed in the core substrate.

15. A method for manufacturing a circuit substrate according to claim 13, wherein the forming of the core substrate comprises forming the intracavity projection structure comprising a pair of intracavity projections projecting toward each other from opposite side surfaces of the cavity.

16. A method for manufacturing a circuit substrate according to claim 13, further comprising:
roughening a plurality of surfaces of at least one of the metal blocks such that the at least one of the metal blocks has a plurality of roughened surfaces which makes contact with the insulating resin layers in the first and second build-up layers on the first and second sides of the core substrate, respectively.

17. A method for manufacturing a circuit substrate according to claim 13, further comprising:
forming a plurality of roughened surfaces on at least one of the metal blocks prior to the accommodating of the plurality of metal blocks.

18. A method for manufacturing a circuit substrate according to claim 13, further comprising:
eroding a plurality of surfaces of at least one of the metal blocks with an acid such that a plurality of roughened surfaces is formed on the at least one of the metal blocks.

19. A method for manufacturing a circuit substrate according to claim 13, further comprising:
forming a first via conductor structure in the insulating resin layer in the first build-up layer;
forming a second via conductor structure in the insulating resin layer in the second build-up layer;
forming an electronic component mounting portion configured to mount an electronic component on a surface of the first build-up layer; and
forming a substrate connecting portion configured to mount a second circuit substrate on a surface of the second build-up layer,
wherein the forming of the second via conductor structure comprises forming the second via conductor structure comprising a larger number of via conductors than the first via conductor structure.

20. A method for manufacturing a circuit substrate according to claim 13, wherein the filling of the filler resin comprises deriving resin from at least one of the insulating resin layers in the first and second build-up layers.

* * * * *